(12) United States Patent
Patti et al.

(10) Patent No.: US 9,711,640 B2
(45) Date of Patent: Jul. 18, 2017

(54) VERTICAL CONDUCTION INTEGRATED ELECTRONIC DEVICE PROTECTED AGAINST THE LATCH-UP AND RELATING MANUFACTURING PROCESS

(71) Applicant: STMICROELECTRONICS S.R.L., Agrate Brianza (IT)

(72) Inventors: Davide Giuseppe Patti, Mascalucia (IT); Antonio Giuseppe Grimaldi, S. Giovanni La Punta (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 15/081,069

(22) Filed: Mar. 25, 2016

(65) Prior Publication Data
US 2017/0092757 A1    Mar. 30, 2017

(30) Foreign Application Priority Data

Sep. 30, 2015  (IT) .................. 102015000056996

(51) Int. Cl.
| | | |
|---|---|---|
| *H01L 29/78* | (2006.01) | |
| *H01L 29/66* | (2006.01) | |
| *H01L 29/10* | (2006.01) | |
| *H01L 29/06* | (2006.01) | |
| *H01L 29/423* | (2006.01) | |
| *H01L 21/8234* | (2006.01) | |

(52) U.S. Cl.
CPC .. *H01L 29/7813* (2013.01); *H01L 21/823487* (2013.01); *H01L 29/063* (2013.01); *H01L 29/1095* (2013.01); *H01L 29/4236* (2013.01); *H01L 29/66734* (2013.01)

(58) Field of Classification Search
CPC .................. H01L 21/8232; H01L 29/66007
See application file for complete search history.

(56) References Cited

U.S. PATENT DOCUMENTS

| | | |
|---|---|---|
| 7,332,398 B2 | 2/2008 | In't Zandt et al. |
| 2009/0072306 A1 | 3/2009 | Izumi |
| 2011/0207296 A1 | 8/2011 | Momota |
| 2012/0261714 A1 | 10/2012 | Taketani et al. |
| 2013/0328062 A1 | 12/2013 | Hisamoto et al. |

FOREIGN PATENT DOCUMENTS

| | | |
|---|---|---|
| GB | 2 103 419 A | 2/1983 |
| JP | 2-3980 A | 1/1990 |
| JP | 3375274 B2 | 2/2003 |
| WO | 2004/055884 A1 | 7/2004 |

*Primary Examiner* — Cheung Lee
(74) *Attorney, Agent, or Firm* — Seed IP Law Group LLP

(57) ABSTRACT

A vertical conduction integrated electronic device including: a semiconductor body; a trench that extends through part of the semiconductor body and delimits a portion of the semiconductor body, which forms a first conduction region having a first type of conductivity and a body region having a second type of conductivity, which overlies the first conduction region; a gate region of conductive material, which extends within the trench; an insulation region of dielectric material, which extends within the trench and is arranged between the gate region and the body region; and a second conduction region, which overlies the body region. The second conduction region is formed by a conductor.

17 Claims, 12 Drawing Sheets

VERTICAL CONDUCTION INTEGRATED ELECTRONIC DEVICE PROTECTED AGAINST THE LATCH-UP AND RELATING MANUFACTURING PROCESS

BACKGROUND

Technical Field

The present disclosure regards a vertical conduction integrated electronic device that is protected against the so-called "latch-up" phenomenon; further, the present disclosure regards the corresponding manufacturing process.

Description of the Related Art

As is known, electronic devices are today available, such as for example MOSFETs or insulated-gate bipolar transistors (IGBTs), which are able to conduct high currents and withstand high voltages. These devices, however, may be subjected to the so-called latch-up phenomenon.

For instance, as shown in FIG. 1 with reference to an IGBT 1, this transistor has a parasitic circuit, which includes a first parasitic transistor 2 and a second parasitic transistor 3, which are, respectively, of a PNP and an NPN type. In addition, the collector of the first parasitic transistor 2 is connected to the base of the second parasitic transistor 3, the collector of which is connected to the base of the first parasitic transistor 2, whereas the emitters of the first and second parasitic transistors 2, 3 are connected to the drain terminal and to the source terminal, respectively, of the IGBT 1. This being said, in latch-up conditions, the first and second parasitic transistors 2, 3 form a closed path flowing in which is a current that is self-sustaining, irrespective of the value of the voltage that controls the IGBT 1. Likewise, in the case of a power MOSFET (not shown), in latch-up conditions, within the corresponding body region, and thus between the source and drain, a current is found to flow also in the case where the gate terminal is set at a zero voltage, which entails, in practice, the impossibility of switching off the MOSFET.

BRIEF SUMMARY

One embodiment of the present disclosure is an integrated electronic device that solves at least in part the drawbacks of the known art.

According to the present disclosure, a vertical conduction integrated electronic device includes a semiconductor body, a trench that extends through part of the semiconductor body and delimits a portion of the semiconductor body, and a gate region of conductive material which extends within the trench. The portion of the semiconductor body forms a first conduction region having a first type of conductivity and a body region having a second type of conductivity, which is arranged on top of the first conduction region. The device also includes an insulation region of dielectric material, which extends within the trench and is arranged between the gate region and the body region; and a second conduction region arranged on top of the body region. The second conduction region is made of an undoped conductor.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

Figure 1:
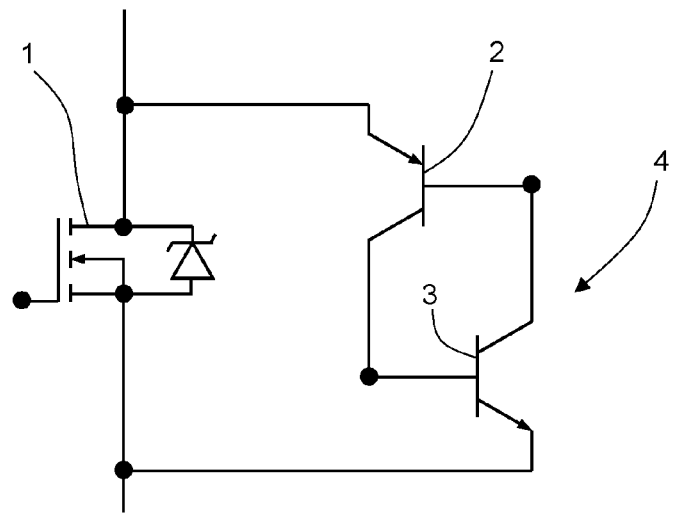
FIG. 1 shows a circuit diagram of an IGBT and of corresponding parasitic transistors.
Figure 2:
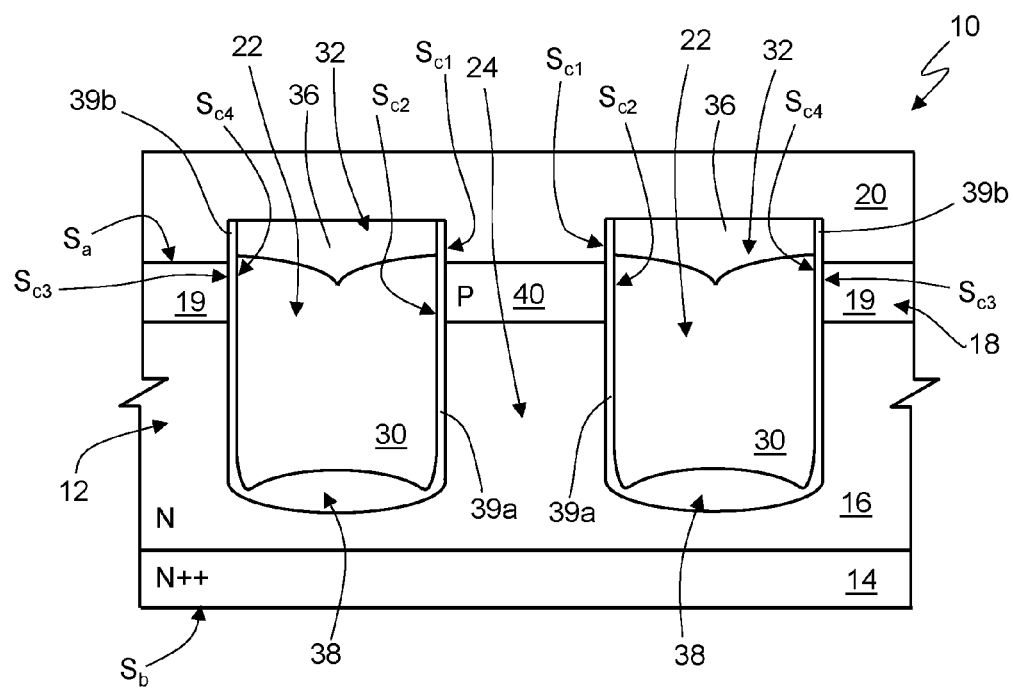
FIGS. 2, 21, 23, and 24 are schematic cross sections (not in scale) of embodiments of the present electronic device.

FIG. 2 shows a transistor 10, which is a trench MOSFET, with vertical current flow.

In detail, the transistor 10 comprises a semiconductor body 12 made, for example, of silicon and comprises a substrate 14, of an N++ type and an epitaxial layer 16 of an N type extending over the substrate. Further, the semiconductor body 12 comprises a region 18 of a P type, which will be referred to in what follows as the top semiconductor region 18. The top semiconductor region 18 extends over the epitaxial layer 16, with which it is in direct contact.

Present on the top semiconductor region 18, and in direct contact with the latter, is a source region 20, of undoped conductive material, such as for example a metal material.

As previously mentioned, the transistor 10 comprises a trench 22, which in top plan view has an annular shape. In particular, the trench 22 extends through a bottom portion of the source region 20, as well as through the top semiconductor region 18 and a top portion of the epitaxial layer 16. Consequently, the trench 22 does not extend within the substrate 14; further, the trench 22 surrounds an active region 24.

Present within the trench 22 is a gate region 30, which in top plan view thus has an annular shape. The gate region 30 is made of conductive material, such as for example polysilicon.

Further present within the trench 22 is an insulation region 32, which is made of dielectric material and surrounds all sides of the gate region 30. In particular, the insulation region 32 includes a first insulation subregion 36, which overlies the gate region 30 and is made, for example, of deposited silicon oxide (TEOS), and a second insulation subregion 38, which surrounds at the lateral sides and underneath the gate region 30 and is made, for example, of silicon oxide.

In detail, the top semiconductor region 18 forms a body region 40, which is arranged in the active region 24 (and is thus surrounded by the trench 22), and a peripheral semiconductor region 19, which is arranged on the outside of the trench 22. The body region 24 and the peripheral semiconductor region 19 are thus separated from one another on account of interposition of the trench 22. Further, extending underneath the body region 40 is a portion of the epitaxial layer 16.

In greater detail, the semiconductor body 12 is delimited at the top and at the bottom, respectively, by a top surface $S_a$ and a bottom surface $S_b$, which are formed, respectively, by the top semiconductor region 18 and by the substrate 14.

Yet in greater detail, FIG. 2 shows a first top portion 39a of the second insulation subregion 38, which is arranged laterally with respect to the gate region 30, contacts the body region 40 and to a first approximation is oriented perpendicular to the top surface $S_a$. The first top portion 39a coats the inner lateral wall of the trench 22 and is delimited laterally by a first lateral surface $S_{c1}$ and a second lateral surface $S_{c2}$, which contact, respectively, i) the body region 40 and the source region 20, and ii) the gate region 30. Further, FIG. 2 also shows a second top portion 39b of the second insulation subregion 38, which surrounds, at a distance, the aforementioned first top portion 39a of the second insulation subregion 38 and is delimited laterally by a third lateral surface $S_3$ and a fourth lateral surface $S_{c4}$, which contact, respectively, i) the peripheral semiconductor region 19 and the source region 20, and ii) the gate region 30. In practice, the second top portion 39b coats the outer lateral wall of the trench 22. Further, the second and fourth lateral surfaces $S_{c2}$, $S_{c4}$ face the gate region 30, whereas the first and third lateral surfaces $S_{c1}$, $S_3$ face the body region 40 and the peripheral semiconductor region 19, respectively.

This being said, assuming a reference system oriented perpendicular to the aforementioned surfaces $S_a$ and $S_b$ and directed from the bottom surface $S_b$ towards the top surface $S_a$, the top surface $S_a$ extends to a height lower than the height of the portion of gate region 30 arranged in contact with the second lateral surface $S_{c2}$. In other words, if we denote by $h_{30}$ the maximum height of the portion of the gate region 30 in contact with the second lateral surface $S_{c2}$, the body region 40, and in particular the portion of the body region 40 in contact with the first lateral surface $S_{c1}$, extends up to a corresponding maximum height, which is lower than the height $h_{30}$. Equivalently, the portion of source region 20 that contacts the body region 40 and the first lateral surface $S_{c1}$ extends at the bottom up to a height lower than the height $h_{30}$. In this connection, FIG. 2 shows, purely by way of example, an embodiment in which the gate region 30 has a non-uniform height. In particular, the height of the gate region 30 decreases starting from the peripheral portions closest to the top semiconductor region 18 towards a central portion of the gate region 30. In other words, in cross-sectional view the gate region 30 exhibits a cusp-shaped profile, with the cusp facing downwards, this cusp being arranged, in top plan view, approximately at the middle of the gate region 30. However possible are embodiments in which the gate region 30 has, for example, a maximum height that is substantially uniform in a direction parallel to the top surface $S_a$.

In practice, a lateral overlap is created between the gate region 30 and the source region 20. In use, the epitaxial layer 16 forms the drain of the transistor 10, whereas the first top portion 39a of the second insulation subregion 38 functions as gate oxide. Consequently, when the gate region 30 is biased at a voltage higher than the threshold voltage of the transistor 10, in the portion of the body region 40 arranged in contact with the first lateral surface $S_{c1}$ the (vertical) conduction channel of the transistor 10 is formed. The lateral overlap between the gate region 30 and the source region 20 guarantees that the source is electrically coupled to the channel.

For practical purposes, since the source region 20 is made of an undoped conductive material, in the transistor 10 no parasitic transistor of an NPN type is present, and consequently latch-up may not occur.

The transistor 10 may be obtained with the manufacturing process described in what follows.

Figure 3:
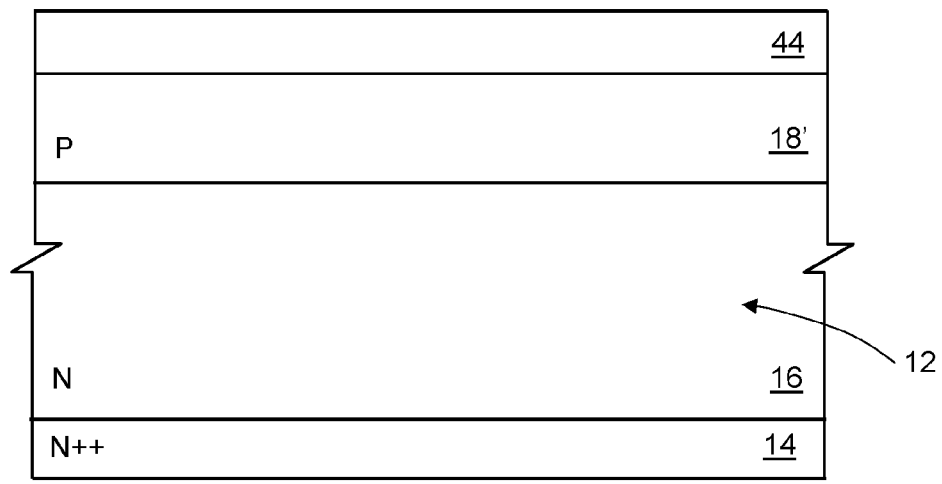
FIGS. 3-18 are schematic cross sections (not in scale) of the embodiment shown in FIG. 2, during successive steps of a manufacturing process.

Initially, as shown in FIG. 3, the semiconductor body 12 is provided, which comprises the substrate 14, the epitaxial layer 16, and a region 18' that is to form the top semiconductor region 18, which will be referred to in what follows as the preliminary top semiconductor region 18'. Formed on the preliminary top semiconductor region 18' is a layer 44 of dielectric material (for example, silicon oxide or TEOS), which will be referred to in what follows as the temporary layer 44. For instance, the temporary layer 44 is formed by thermal oxidation or by chemical deposition.

Figure 4:
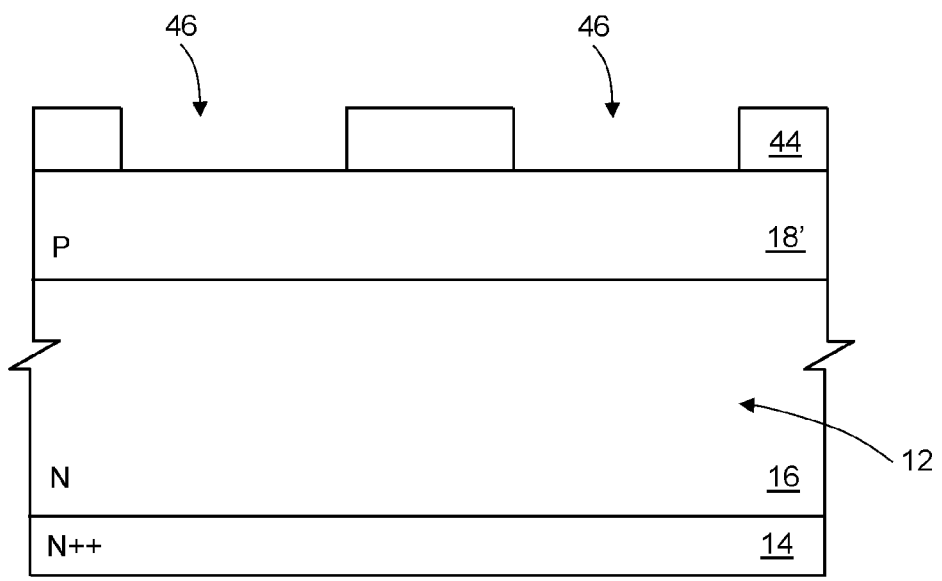

Next, as shown in FIG. 4, a photolithographic process and a subsequent anisotropic etch are carried out in order to remove selectively a portion of the temporary layer 44 for forming a window 46 of an annular shape in the temporary layer 44.

Figure 5:
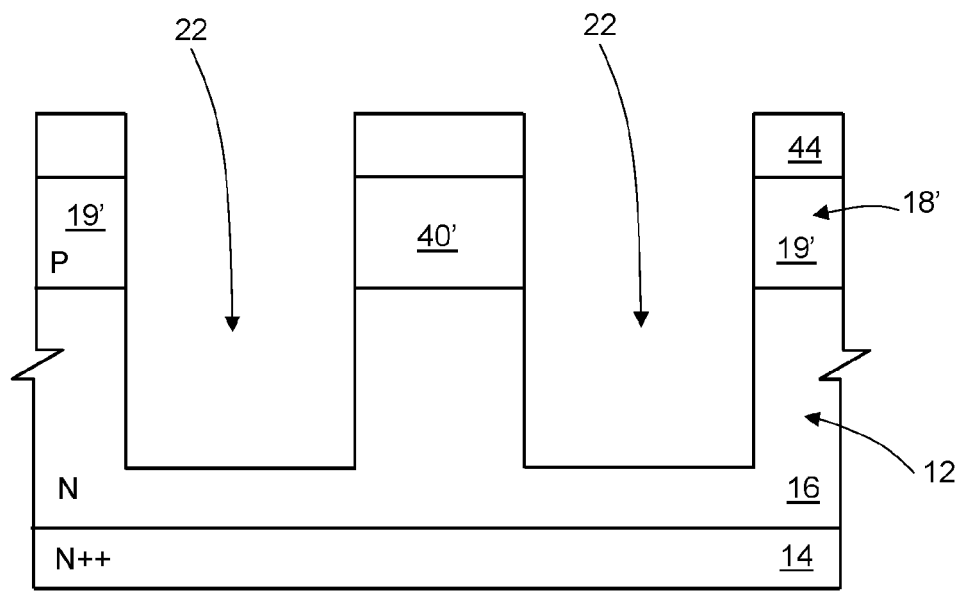

Next, as shown in FIG. 5, the window 46 is used in a subsequent etch, which enables selective removal of a portion of the preliminary top semiconductor region 18' and an underlying portion of the epitaxial layer 16, to form the trench 22. This operation entails separation, within the preliminary top semiconductor region 18', of a region 40', which is to form the body region 40, and a region 19', which is to form the peripheral semiconductor region 19, which will be referred to in what follows as the preliminary body region 40' and the preliminary peripheral semiconductor region 19', respectively.

Figure 6:
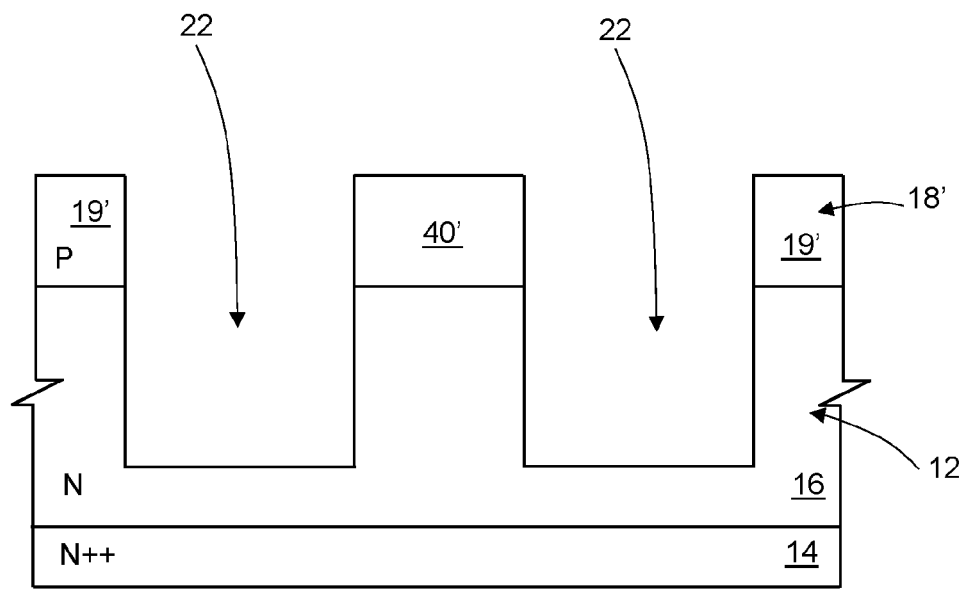

Next, as shown in FIG. 6, the remaining portion of the temporary layer 44 is removed.

Figure 7:
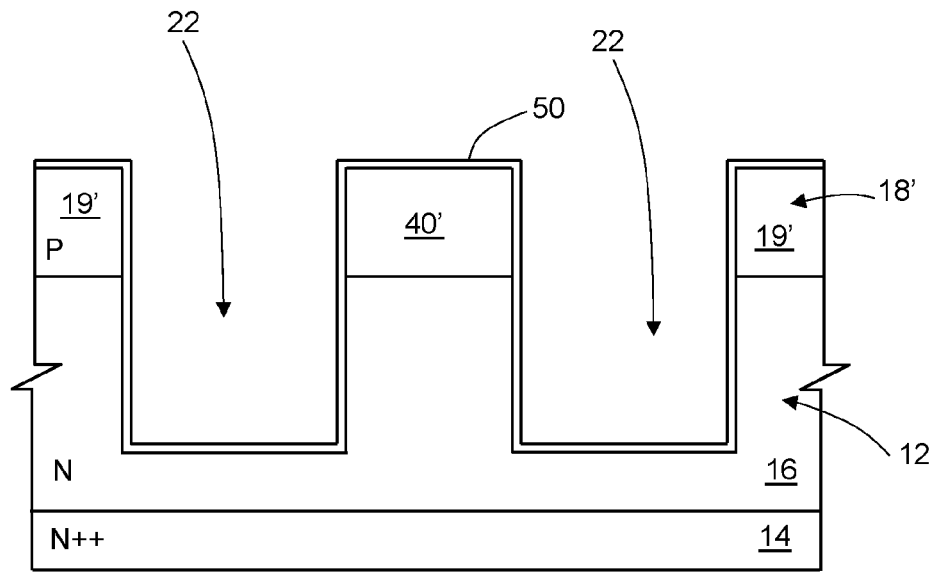

Next, as shown in FIG. 7, formed in a per se known manner is a layer 50 of dielectric material, which will be referred to in what follows as the thin dielectric layer 50. For instance, the thin dielectric layer 50 is made of silicon oxide and is obtained by thermal oxidation, or else is made of TEOS oxide, formed by deposition. Further, the thin dielectric layer 50 has a thickness of, for example, to 50 nm.

In greater detail, the thin dielectric layer 50 extends on the preliminary top semiconductor region 18', as well as within the trench 22, for coating the bottom and the lateral walls of the latter.

Figure 8:
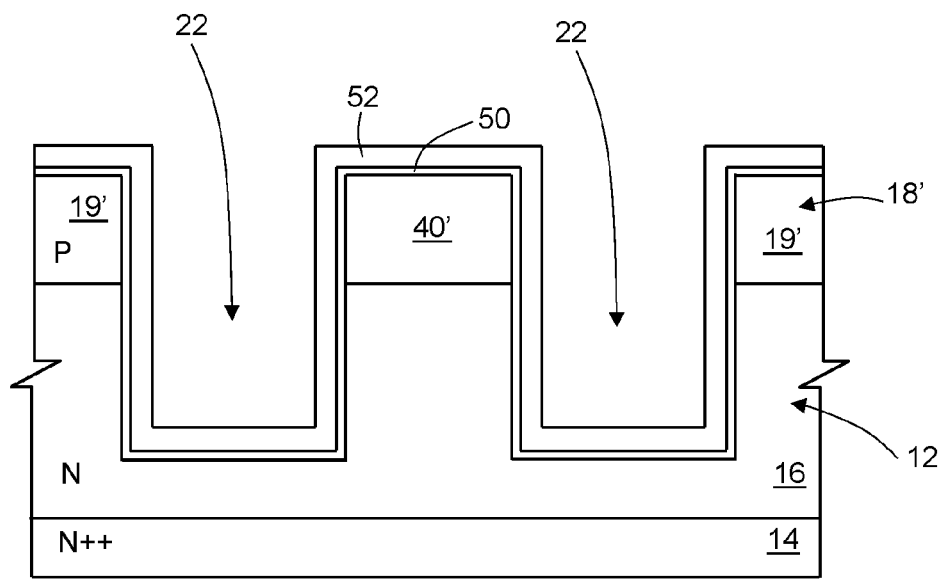

Next, as shown in FIG. 8, formed on the thin dielectric layer 50 is a further dielectric layer 52, which will be referred to in what follows as the thick dielectric layer 52.

The thick dielectric layer 52 is made, for example, of silicon nitride ($Si_3N_4$) and has a thickness, for example, comprised between 70 nm and 100 nm. The presence of the thin dielectric layer 50 enables reduction of the mechanical stresses induced in the semiconductor body 12 during the subsequent steps of the manufacturing process.

Figure 9:
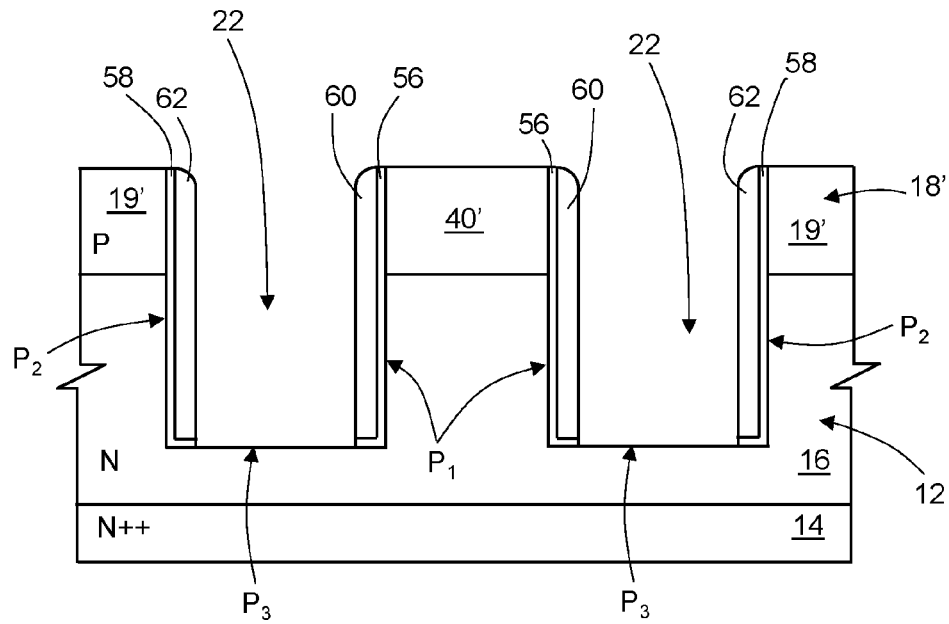

Next, as shown in FIG. 9, selective removal is carried out (for example, by an anisotropic chemical etch) of portions of the thin dielectric layer 50 and of the thick dielectric layer 52 arranged on the preliminary body region 40' and the preliminary peripheral semiconductor region 19', thus outside the trench 22, as well as portions of the thin dielectric layer 50 and of the thick dielectric layer 52 that coat the bottom of the trench 22. In this connection, in what follows referred to, respectively, as the first lateral wall $P_1$ and second lateral wall $P_2$ of the trench 22 are the inner lateral wall and the outer lateral wall of the trench 22, as well as the bottom wall $P_3$ of the trench 22. Following upon the operations described previously, the bottom wall $P_3$ of the trench 22 is exposed, whereas the first and second lateral walls $P_1$, $P_2$ of the trench 22 are coated by a first coating layer 56 and a second coating layer 58, respectively, which are formed by residual portions of the thin dielectric layer 50; in turn, the first and second coating layers 56, 58 are coated, respectively, by a first spacer 60 and a second spacer 62, which are formed by residual portions of the thick dielectric layer 52.

Figure 10:
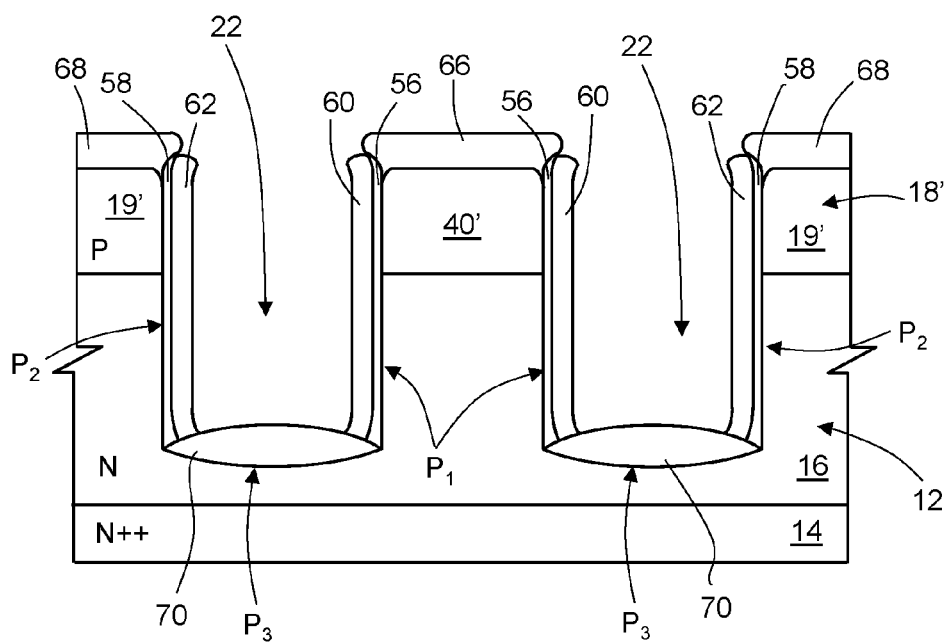

Next, as shown in FIG. 10, a process of thermal oxidation is carried out, which entails oxidation of the exposed portions of semiconductor material, not coated either by the first spacer 60 or by the second spacer 62. This operation entails formation, on the preliminary body region 40', of a corresponding dielectric region, which will be referred to in what follows as the central dielectric region 66. Further, this operation entails formation, on the peripheral semiconductor region 19, of a corresponding dielectric region 68, which will be referred to in what follows as the peripheral dielectric region 68; for example, the central dielectric region 66 and the peripheral dielectric region 68 have a thickness comprised between 0.2 μm and 0.3 μm. In addition, this operation of oxidation entails formation, by the central dielectric region 66 and the peripheral dielectric region 68, of corresponding projections that extend towards the trench 22, as well as entailing curving in the direction of the trench 22 of the top portions and bottom portions of the first and second spacers 60, 62. In particular, the projections of the central dielectric region 66 and of the peripheral dielectric region 68 project towards the inside of the trench 22 with respect to the preliminary body region 40'. Further, said operation of oxidation entails formation, on the bottom of the trench 22, of a further dielectric region 70, which will be referred to in what follows as the bottom dielectric region 70.

Once again with reference to FIG. 10, here the central dielectric region 66, the peripheral dielectric region 68, the bottom dielectric region 70, and the first and second coating layers 56, 58 are shown in a distinct way, for reasons of clarity, even though they may be made of a same material and may thus form a single dielectric region, made, for example, of oxide.

Figure 11:
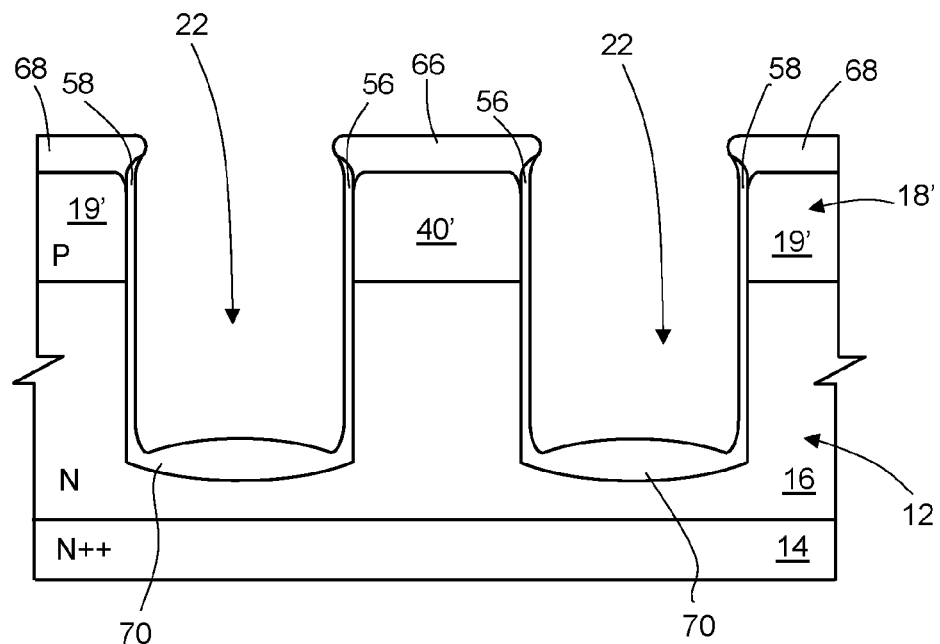

Next, as shown in FIG. 11, an isotropic etch is made to remove the first and second spacers 60, 62.

Figure 12:
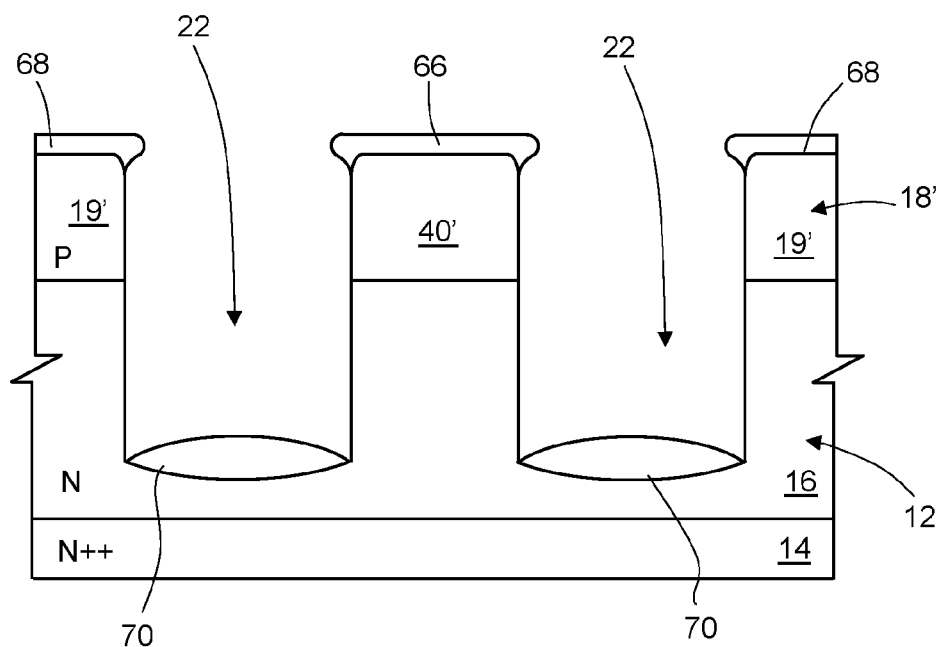

Then, as shown in FIG. 12, a further etch is made (for example, an isotropic chemical etch in a liquid or nebulized environment) to remove the first and second coating layers 56, 58, which may have previously undergone contamination. Albeit not shown, this operation entails a slight reduction of the thickness of the central dielectric region 66, of the peripheral dielectric region 68, and of the bottom dielectric region 70.

Figure 13:
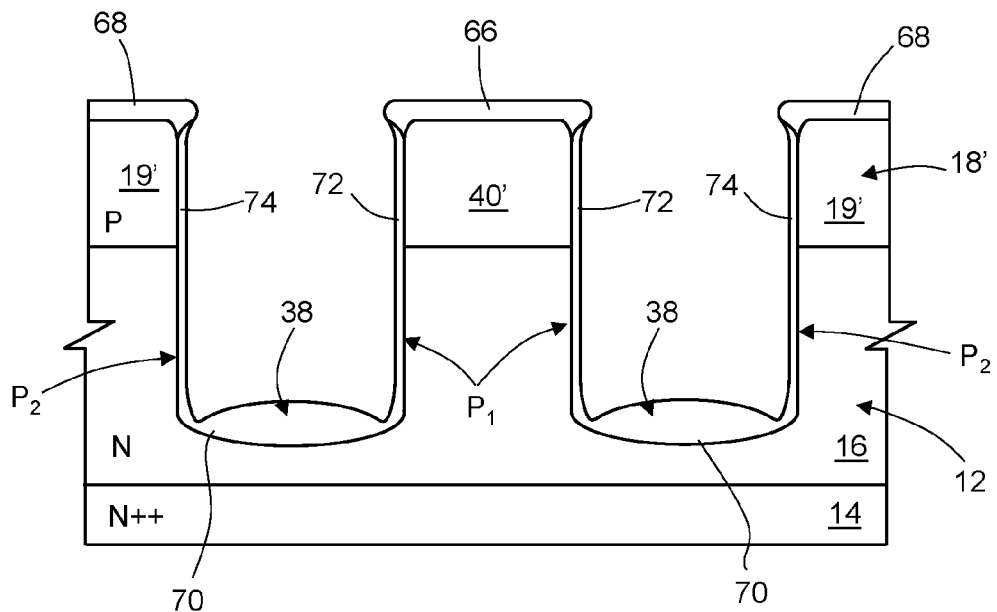

Next, as shown in FIG. 13, a new oxidation process is carried out. In this way, on the first and second lateral walls $P_1$, $P_2$ of the trench 22 a first oxide layer 72 and a second oxide layer 74 are formed, respectively, which will be referred to in what follows as the first and second oxide layers 72, 74. The first and second oxide layers 72, 74 contact the bottom dielectric region 70 for forming the second insulation subregion 38.

In greater detail, albeit not shown, the oxidation process described with reference to FIG. 13 entails also a slight increase in the thickness of the central dielectric region 66, of the peripheral dielectric region 68, and of the bottom dielectric region 70. Further, even though in FIG. 13 the first and second oxide layers 72, 74 are shown as distinct with respect to the central dielectric region 66 and the peripheral dielectric region 68, they may be made of the same material of which the latter are made.

Once again with reference to FIG. 13, this shows how, thanks to the prior use of the first and second spacers 60, 62, it is possible to coat the bottom wall $P_3$ of the trench 22 with an insulating region (in the case in point, the bottom dielectric region 70) having a thickness greater than the thickness of the first and second oxide layers 72, 74. In this way, insulation of the gate region 30 towards the drain region is improved, without this entailing an increase of the threshold voltage of the transistor 10.

Figure 14:
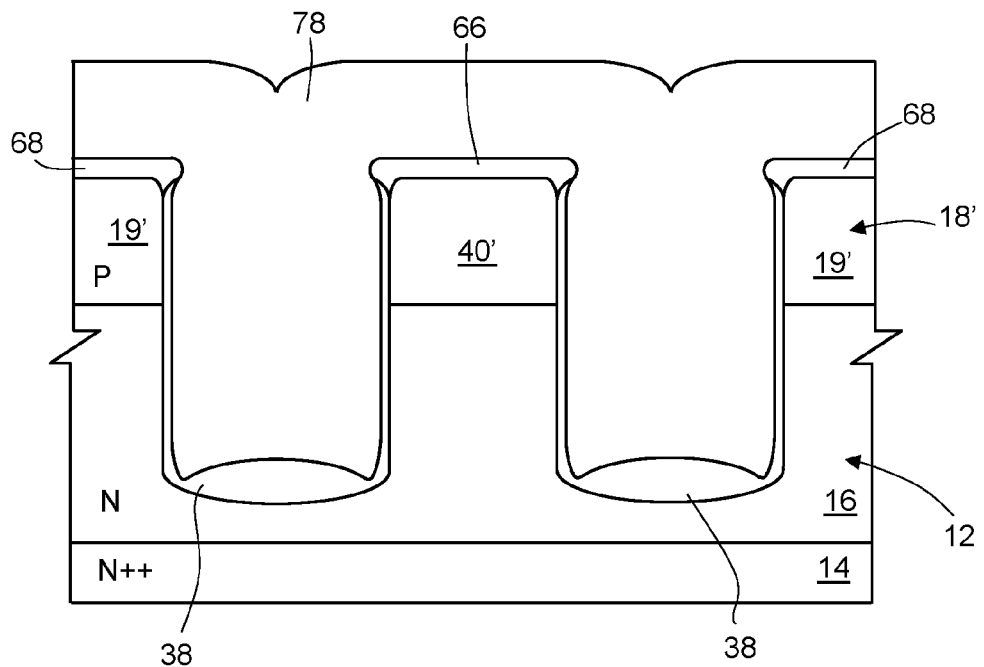

Next, as shown in FIG. 14, a conductive region 78, made, for example, of polysilicon is formed. For instance, the conductive region 78 may be formed by successive deposition of layers.

In detail, the conductive region 78 overlies the central dielectric region 66 and the peripheral dielectric region 68. In addition, the conductive region 78 fills the trench 22 completely. In this connection, without this implying any loss of generality, the trench 22 has a depth that is, for example, twice the respective width.

Figure 15:
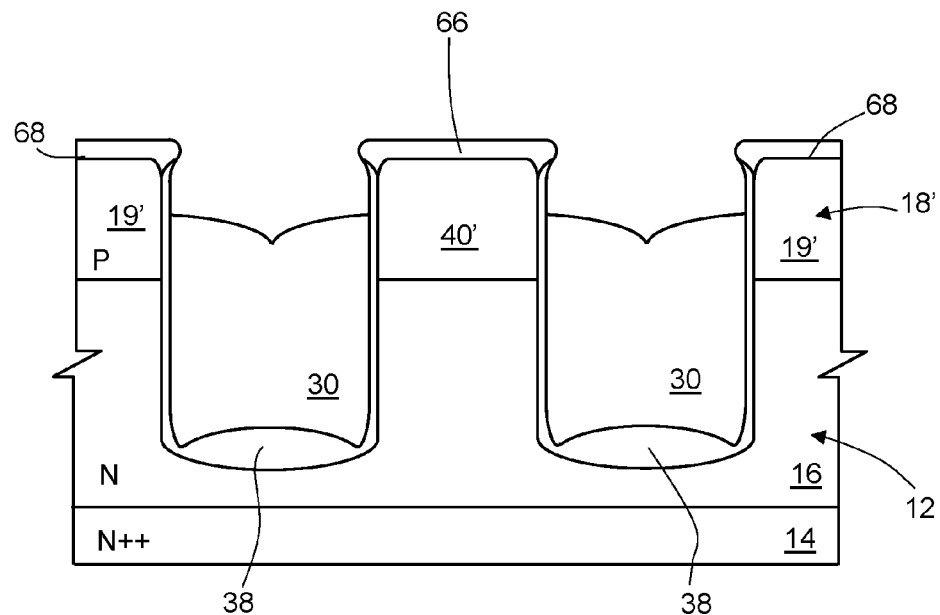

Next, as shown in FIG. 15, an anisotropic etch is made, in order to reduce the thickness of the conductive region 78 so that the residual portion of conductive region 78 forms the gate region 30. In other words, following upon this etch, just a portion of conductive region 78 remains, which occupies the trench 22 starting from the bottom up to a height lower than the maximum height of the semiconductor body 12. For instance, the residual portion of the conductive region 78 has a maximum height 0.4 μm lower than the maximum height of the semiconductor body 12.

In greater detail, and without any loss of generality, etching of the conductive region 78 may be carried out by a homogeneous "etch back", in which case the gate region 30 assumes the aforementioned cusp shape.

Figure 16:
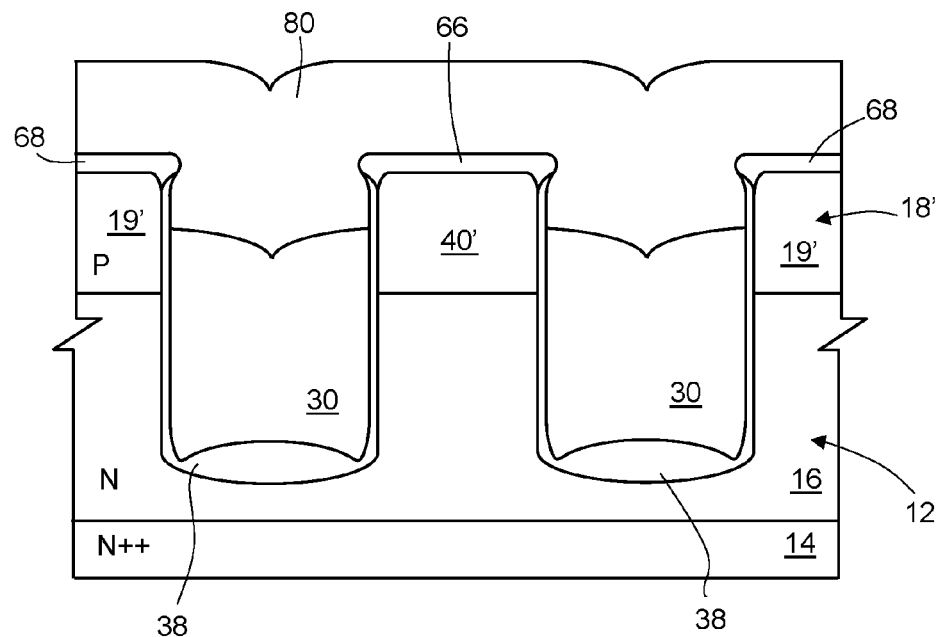

Next, as shown in FIG. 16, dielectric material (for example, silicon oxide) is deposited for forming a top dielectric region 80, which is arranged on top of the central dielectric region 66 and of the peripheral dielectric region 68. Further, the top dielectric region 80 extends within a top portion of the trench 22 until it contacts the gate region 30.

Figure 17:
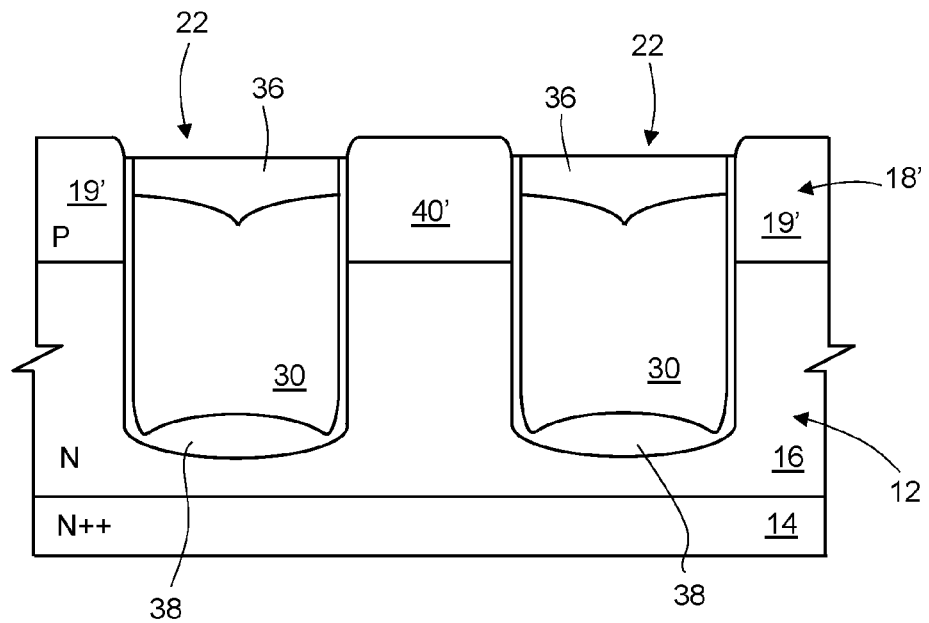

Next, as shown in FIG. 17, a new anisotropic etch is made in order to remove a top portion of the top dielectric region 80, the central dielectric region 66, and the peripheral dielectric region 68 for exposing the preliminary body region 40' and the preliminary peripheral semiconductor region 19'. In addition, this etch entails removal of a portion of the top dielectric region 80 arranged inside the trench 22. In this way, the residual portion of top dielectric region 80 forms the first insulation subregion 36, the maximum height of which is, for example, 0.2 μm lower than the maximum height of the preliminary top semiconductor region 18'.

Figure 18:
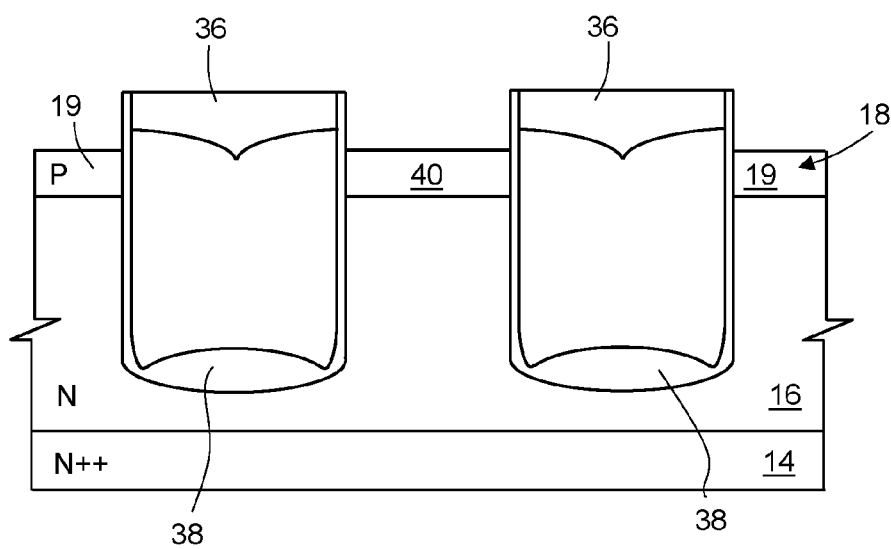

Next, as shown in FIG. 18, a new etch (for example, a chemical etch of silicon in moist, liquid, or nebulized environment) is made in order to reduce the thickness of the preliminary body region 40' and of the preliminary peripheral semiconductor region 19'. The residual portions of the preliminary body region 40' and of the preliminary peripheral semiconductor region 19' form, respectively, the body region 40 and the peripheral semiconductor region 19.

Next, in a way not shown, the source region 20 is formed for example by deposition of metal material.

Figure 19:
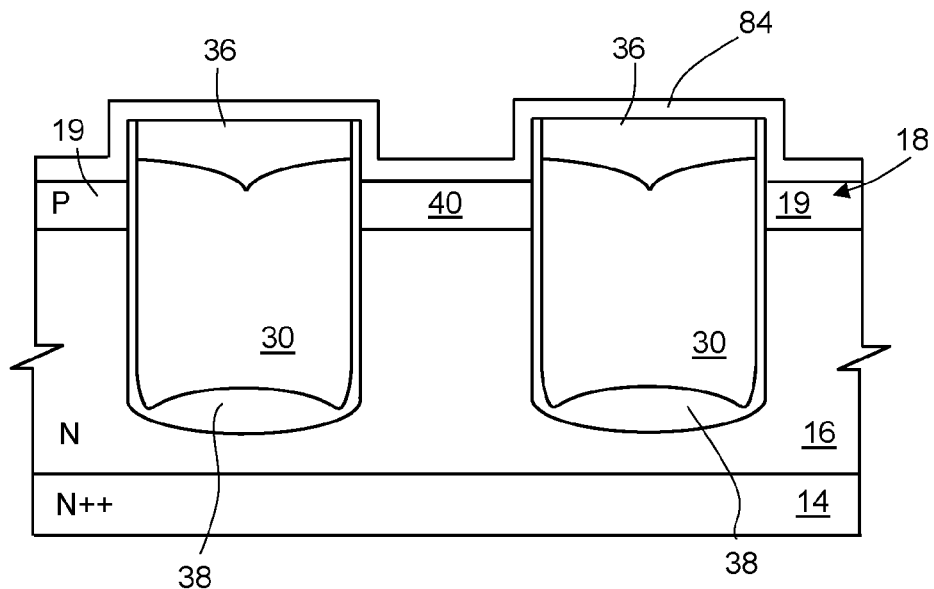
FIGS. 19-20 are schematic cross sections (not in scale) of the embodiment shown in FIG. 21, during successive steps of a manufacturing process.

According to a variant of the manufacturing process previously described, following upon execution of the operations described with reference to FIG. 18, it is possible to carry out the operations shown in FIG. 19.

In detail, formed, for example by deposition, on the body region 4, the peripheral semiconductor region 19, and the first insulation subregion 36 is a further layer 84 of silicon nitride, which will be referred to in what follows as the additional layer 84.

Figure 20:
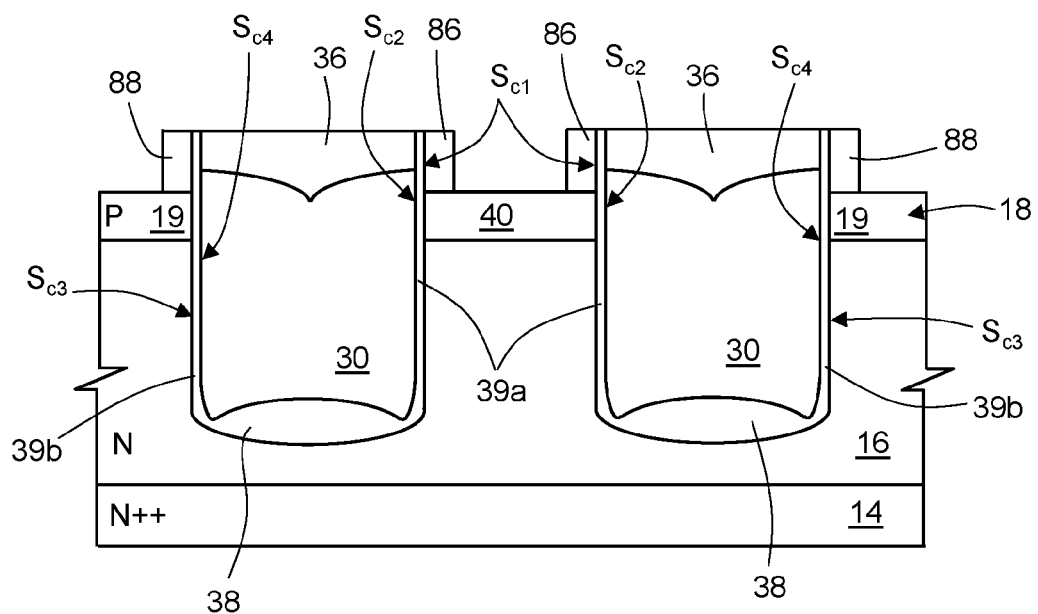

Next, as shown in FIG. 20, portions of the additional layer 84 that extend over the first insulation subregion 36, as well as over a central portion of the body region 40, are selectively removed, for example with an anisotropic etch. The residual portions of the additional layer 84 form a third spacer 86 and a fourth spacer 86, 88. The third spacer 86 coats a top portion of the first lateral surface $S_{c1}$ of the first top portion 39a of the second insulation subregion 38, until it contacts a peripheral portion of the body region 40. A central portion of the body region 40 is, instead, in contact with a portion of the source region 20, which is surrounded by the third spacer 86. The fourth spacer 88 coats, instead, a top portion of the third lateral surface $S_{c3}$ of the second top portion 39b of the second insulation subregion 38, until it contacts the peripheral semiconductor region 19.

Figure 21:
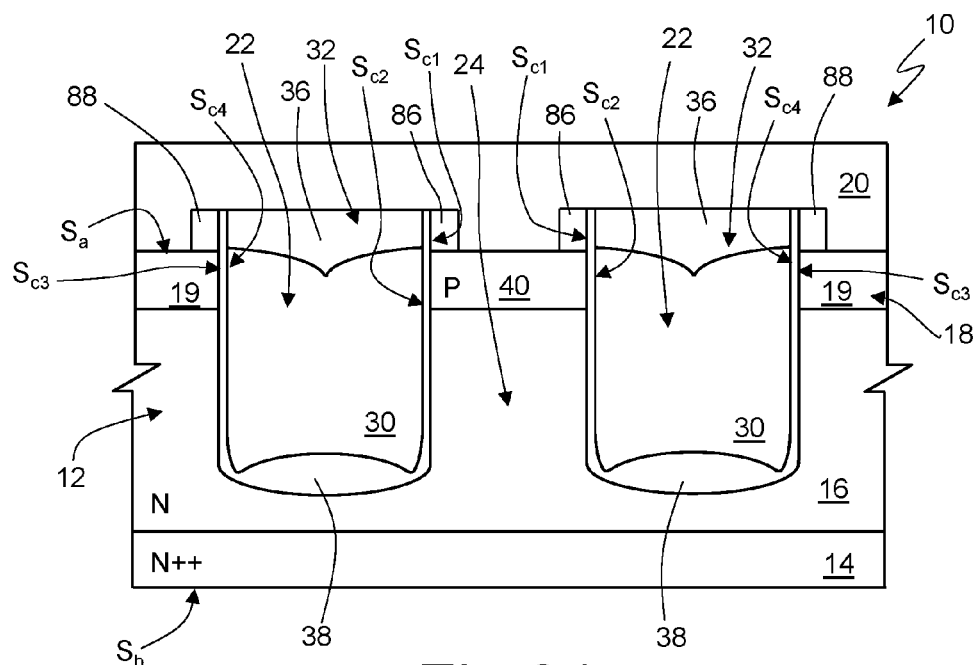

In the case where the operations represented in FIG. 20 are carried out, the transistor 10 assumes the shape shown in FIG. 21. Further, the presence of the third and fourth spacers 86, 88 enables improvement of the electrical insulation between the source region 20 and the gate region 30.

Figure 22:
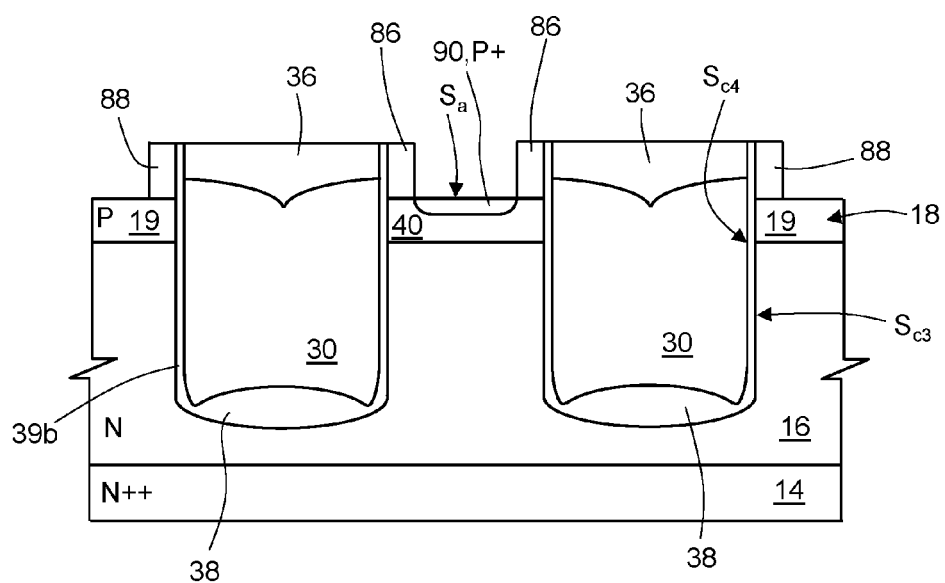
FIG. 22 is a schematic cross section (not in scale) of the embodiment shown in FIG. 23, during a step of a manufacturing process.

Optionally, following upon the operations represented in FIG. 20, and prior to formation of the source region 20, it is possible to carry out an ion implantation within the exposed portion of body region 40, i.e., within the portion of body region 40 not covered by the third spacer 86. In this way, as shown in FIG. 22, an enriched region 90 of a P+ type is formed, which extends within the body region 40, starting from the top surface $S_a$, without contacting the underlying epitaxial layer 16. The enriched region 90 is laterally staggered with respect to the third spacer 86.

Figure 23:
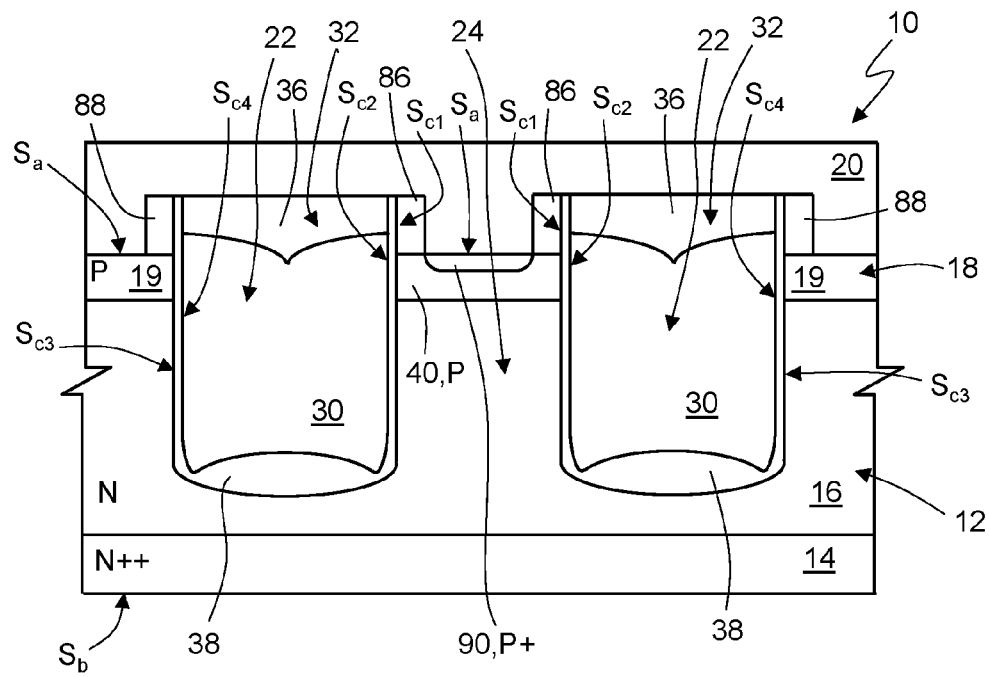

In the case where the operations represented in FIG. 22 are carried out, the transistor 10 assumes the shape shown in FIG. 23. The presence of the enriched region 90 enables improvement of the electrical behavior of the diode formed by the body region 40 and by the underlying portion of epitaxial layer 16, without affecting the channel of the transistor 10.

Figure 24:
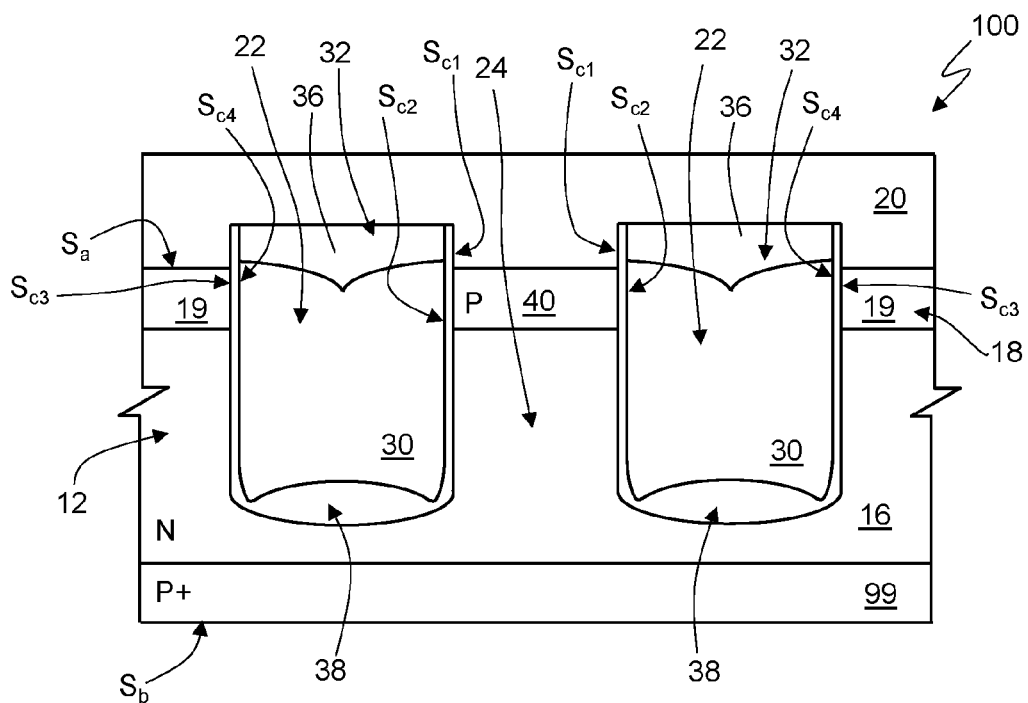

Further possible are embodiments that are the same as corresponding embodiments described previously, but in which the substrate is of a P+ type, instead of an N+ type. In this case, the transistor, designated by 100, is of an IGBT type and the epitaxial layer 16 functions as so-called "drift layer". An example of such embodiments is shown in FIG. 24, where the substrate is designated by 99. In this connection, the substrate 99 functions as collector of the transistor 100. Albeit not shown, further possible are embodiments in which the substrate is of a P+ type and which include the third and fourth spacers 86, 88 as well as possibly the enriched region 90.

The electronic device described presents numerous advantages. In particular, thanks to the fact that the source region 20 is made of undoped conductive material, formation of the parasitic transistor of an NPN type is prevented, and thus latch-up thereof is likewise prevented. In particular, in the case of a MOSFET, there is just one diode, formed by the body region 40 and by the underlying portion of the epitaxial layer 16. Instead, in the case of an IGBT, just the parasitic PNP transistor is present, which in any case does not give rise to latch-up, since it has an $h_{fe}$ parameter lower than one.

Finally, it is clear that modifications and variations may be made to the electronic device and to the manufacturing process described and illustrated herein, without thereby departing from the scope of the present disclosure.

For instance, the types of doping may be reversed with respect to what has been described.

As regards the trench 22, it may have, in top plan view, an arbitrary shape, such as for example a circular or elliptical shape.

Some steps of the manufacturing process may be carried out in a different order with respect to what has been described. In addition, one or more regions of the transistor may be formed in a way different from what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical conduction integrated electronic device comprising:
   a semiconductor body;
   a trench that extends through part of the semiconductor body and delimits a portion of the semiconductor body, said portion of the semiconductor body forming a first conduction region having a first type of conductivity and a body region having a second type of conductivity, which is arranged on top of the first conduction region;
   a gate region of conductive material, which extends within the trench;
   an insulation region of dielectric material, which extends within the trench and is arranged between the gate region and the body region; and
   a second conduction region, arranged on top of the body region, wherein the second conduction region is made of an undoped conductor, wherein the insulation region includes a lateral surface that contacts the body region; said device further comprising a spacer of dielectric material, which coats a top portion of said lateral surface and contacts a peripheral portion of the body region, said spacer further surrounding a central portion of the second conduction region arranged in contact with a central portion of the body region.

2. The device according to claim 1, wherein the body region includes a front surface, said device further comprising an enriched region having the second type of conductivity, which extends within the body region starting from said front surface and is in contact with the central portion of the second conduction region, said enriched region having a level of doping higher than a level of doping of the body region.

3. The device according to claim 1, wherein the gate region and the second conduction region at least partially overlap laterally.

4. The device according to claim 1, which forms a MOSFET;
   wherein the semiconductor body comprises:
   a bottom semiconductor region having the first type of conductivity; and
   a top semiconductor region having the second type of conductivity, arranged in contact with the bottom semiconductor region and with the second conduction region; wherein the trench extends through the top semiconductor region and a part of the bottom semiconductor region.

5. The device according to claim 1, wherein the semiconductor body comprises:
   a substrate having the second type of conductivity;
   a bottom semiconductor region having the first type of conductivity, arranged in contact with the substrate; and
   a top semiconductor region having the second type of conductivity, arranged in contact with the bottom semiconductor region and with the second conductive region; wherein the trench extends through the top semiconductor region and a part of the bottom semiconductor region.

6. The device according to claim 1, wherein the trench, gate region, and insulation region are annular and completely laterally surround the body region, the insulation region surrounding all sides of the gate region.

7. The device according to claim 1, wherein the trench extends into the second conduction region and a top side of the gate region extends above a top side of the semiconductor body.

8. A vertical conduction integrated electronic device comprising:
   a semiconductor body;
   a conductive gate region that extends through part of the semiconductor body and completely laterally surrounds a portion of the semiconductor body, said portion of the semiconductor body forming a first conduction region having a first type of conductivity and a body region having a second type of conductivity, which is arranged on top of the first conduction region;
   a dielectric insulation region that laterally surrounds the gate region and is arranged between the gate region and the portion of the semiconductor body; and
   a second conduction region arranged on top of the body region, the second conduction region being made of an undoped conductor, wherein the insulation region includes a lateral surface that contacts the body region; said device further comprising a spacer of dielectric material, which coats a top portion of said lateral surface and contacts a peripheral portion of the body region, said spacer further surrounding a central portion of the second conduction region arranged in contact with a central portion of the body region.

9. The device according to claim 8, wherein the body region includes a front surface, said device further comprising an enriched region having the second type of conductivity, which extends within the body region starting from said front surface and is in contact with the central portion of the second conduction region, said enriched region having a level of doping higher than a level of doping of the body region.

10. The device according to claim 8, wherein the semiconductor body comprises:
    a bottom semiconductor region having the first type of conductivity; and
    a top semiconductor region having the second type of conductivity, arranged in contact with the bottom semiconductor region and with the second conduction region; wherein the gate region and insulation region extend through the top semiconductor region and a part of the bottom semiconductor region.

11. The device according to claim 8, wherein the gate region and insulation region are annular and completely laterally surround the body region, the insulation region surrounding all sides of the gate region.

12. The device according to claim 8, wherein the gate region and insulation region extend into the second conduction region and a top side of the gate region extends above a top side of the semiconductor body.

13. A vertical conduction integrated electronic device comprising:
    a semiconductor body;
    a conductive gate region that extends through part of the semiconductor body;
    a dielectric insulation region that delimits a portion of the semiconductor body and extends between the portion of the semiconductor body and the gate region, the portion of the semiconductor body including a first conduction region having a first type of conductivity and a body region having a second type of conductivity, which is arranged on top of the first conduction region, wherein the insulation region includes a lateral surface that contacts the body region;
    a second conduction region arranged on top of the body region, the second conduction region being made of an undoped conductor; and
    a spacer of dielectric material, which coats a top portion of said lateral surface and contacts a peripheral portion of the body region, said spacer further surrounding a central portion of the second conduction region arranged in contact with a central portion of the body region.

14. The device according to claim 13, wherein the body region includes a front surface, said device further comprising an enriched region having the second type of conductivity, which extends within the body region starting from said front surface and is in contact with the central portion of the second conduction region, said enriched region having a level of doping higher than a level of doping of the body region.

15. The device according to claim 13, wherein the semiconductor body comprises:
    a bottom semiconductor region having the first type of conductivity; and
    a top semiconductor region having the second type of conductivity, arranged in contact with the bottom semiconductor region and with the second conduction region; wherein the gate region and insulation region extend through the top semiconductor region and a part of the bottom semiconductor region.

16. The device according to claim 13, wherein the gate region and insulation region are annular and completely laterally surround the body region, the insulation region surrounding all sides of the gate region.

17. The device according to claim 13, wherein the gate region and insulation region extend into the second conduction region and a top side of the gate region extends above a top side of the semiconductor body.

* * * * *